US012665176B2

(12) United States Patent (10) Patent No.: US 12,665,176 B2
Igosawa et al. (45) Date of Patent: Jun. 23, 2026

(54) ETCHING PROCESSING APPARATUS, ETCHING PROCESSING SYSTEM, ANALYSIS APPARATUS, ETCHING PROCESSING METHOD, AND STORAGE MEDIUM

(71) Applicant: Tokyo Electron Limited, Tokyo (JP)

(72) Inventors: Ryo Igosawa, Miyagi (JP); Hironari Sasagawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 352 days.

(21) Appl. No.: 18/195,463

(22) Filed: May 10, 2023

(65) Prior Publication Data

US 2023/0369032 A1 Nov. 16, 2023

(30) Foreign Application Priority Data

May 11, 2022 (JP) ................................. 2022-077950

(51) Int. Cl.
  *G05B 13/04* (2006.01)
  *G05B 13/02* (2006.01)
  *H01J 37/32* (2006.01)
(52) U.S. Cl.
  CPC .... *H01J 37/32926* (2013.01); *G05B 13/0265* (2013.01); *G05B 13/042* (2013.01); *H01J 2237/334* (2013.01)
(58) Field of Classification Search
  CPC ............... G05B 13/042; G05B 13/0265; H01J 37/32926; H01J 2237/334

USPC .......................................................... 700/121
See application file for complete search history.

(56) References Cited

U.S. PATENT DOCUMENTS

| | | | |
|---|---|---|---|
| 7,358,494 B1* | 4/2008 | Gao | G01N 23/227 |
| | | | 378/50 |
| 2015/0012255 A1* | 1/2015 | Li | G05B 17/02 |
| | | | 703/6 |
| 2019/0286632 A1* | 9/2019 | Okuyama | G06F 16/2462 |
| 2020/0372303 A1* | 11/2020 | Suzuki | G06F 16/285 |
| 2020/0410413 A1* | 12/2020 | Moki | G05B 19/4155 |

FOREIGN PATENT DOCUMENTS

WO 2019/131608 A1 7/2019

* cited by examiner

*Primary Examiner* — Jigneshkumar C Patel
(74) *Attorney, Agent, or Firm* — XSENSUS LLP

(57) ABSTRACT

An etching processing apparatus includes a storage that stores a learned model of each group generated by each learning processing in a case where each processing condition acquired during execution of a specific step of an etching processing, is classified into a plurality of groups according to a difference in effects when executing the specific step, and the learning processing is performed for each group; an updating unit that updates the learned model of a specific group when an effect of executing the specific step on a test wafer using setting data included in a processing condition associated with the specific group is not equivalent to an effect associated with the specific group; and a searching unit that searches for, using the updated learned model, setting data capable of obtaining the effect associated with the specific group when the specific step is executed on the test wafer.

16 Claims, 14 Drawing Sheets

FIG. 6

ETCHING PROCESSING STEP1

| DATA GROUP IDENTIFIER | SETTING DATA (R) | OUTPUT DATA (E) | MEASUREMENT DATA (Pl) | EXPERIMENTAL DATA (Pr) | EFFECT |
|---|---|---|---|---|---|
| DATA001 | ·Pressure_1<br>·Power_1<br>·Gas_1<br>·Temperature_1<br>· · · | ·Vpp_1<br>·Vdc_1<br>·OES_1<br>·Reflect_1<br>·Top DCS current_1<br>· · · | ·Plasma density_1<br>·Ion energy_1<br>·Ion flux_1<br>· · · | ·Etching rate_1<br>·Deposition rate_1<br>·XY position_1<br>·Film type_1<br>·Vertical/Lateral_1<br>· · · | EFFECT<1> |
| DATA002 | ·Pressure_2<br>·Power_2<br>·Gas_2<br>·Temperature_2<br>· · · | ·Vpp_2<br>·Vdc_2<br>·OES_2<br>·Reflect_2<br>·Top DCS current_2<br>· · · | ·Plasma density_2<br>·Ion energy_2<br>·Ion flux_2<br>· · · | ·Etching rate_2<br>·Deposition rate_2<br>·XY position_2<br>·Film type_2<br>·Vertical/Lateral_2<br>· · · | EFFECT<2> |
| · · · | · · · | · · · | · · · | · · · | · · · |

FIG. 7
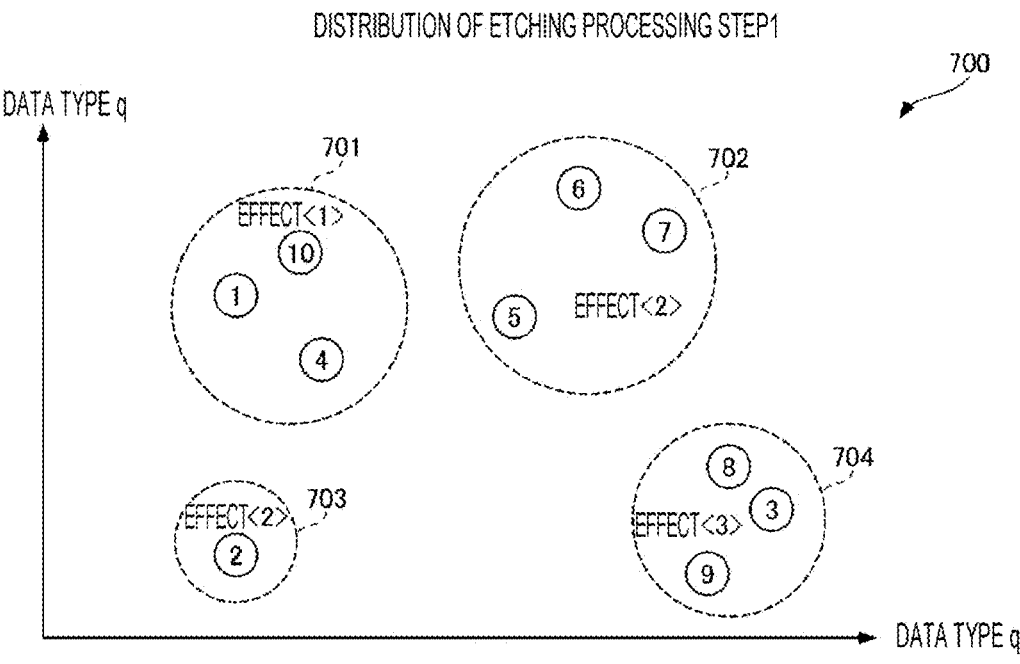
DISTRIBUTION OF ETCHING PROCESSING STEP1
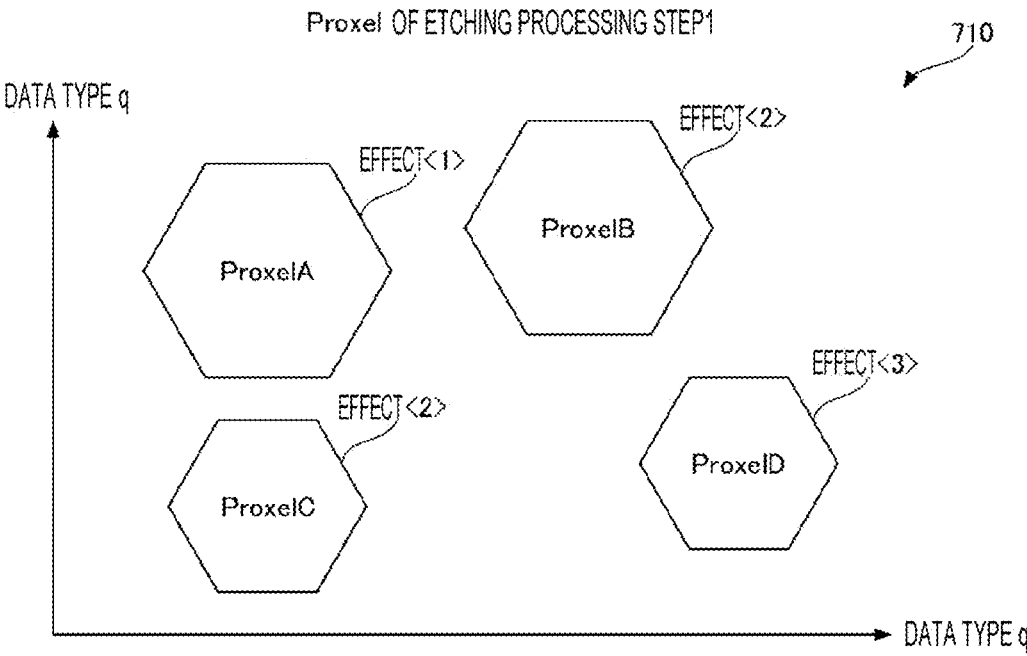
Proxel OF ETCHING PROCESSING STEP1

*FIG. 8*

| CLASSIFICATION | ETCHING PROCESSING STEP1 | | | |
| | SETTING DATA (R) | OUTPUT DATA (E) | MEASUREMENT DATA (Pl) | EXPERIMENTAL DATA (Pr) |
|---|---|---|---|---|
| GROUP Gr1 (EFFECT⟨1⟩) | ·Pressure_1~ Pressure_4 ·Power_10~ Power_1 ·Gas_1~ Gas_10 ·Temperature_1~ Temperature_4 · · · | ·Vpp_4~ Vpp_1 ·Vdc_1~ Vdc_10 ·OES_10~ OES_1 ·Reflect_4~ Reflect_10 ·Top DCS current_1~ Top DCS current_4 · · · | ·Plasma density_10~ Plasma density_4 ·Ion energy_1~ Ion energy_4 ·Ion flux_10~ Ion flux_1 · · · | ·Etching rate_10~ Etching rate_1 ·Deposition rate_4~ Deposition rate_10 ·XY position_10~ XY position_4 ·Film type_1~ Film type_10 ·Vertical/Lateral_1~ Vertical/Lateral_4 · · · |
| GROUP Gr2 (EFFECT⟨2⟩) | · · · | · · · | · · · | · · · |

800

ProxelA

ETCHING PROCESSING APPARATUS, ETCHING PROCESSING SYSTEM, ANALYSIS APPARATUS, ETCHING PROCESSING METHOD, AND STORAGE MEDIUM

CROSS-REFERENCE TO RELATED APPLICATIONS

The present application is based on and claims priority from Japanese Patent Application No. 2022-077950, filed on May 11, 2022, with the Japan Patent Office, the disclosure of which is incorporated herein in its entirety by reference.

TECHNICAL FIELD

The present disclosure relates to an etching processing apparatus, etching processing system, analysis apparatus, etching processing method, and storage medium.

BACKGROUND

A prediction model (learned model), which predicts the cross-sectional shape of a processed wafer when the wafer is etched under a predetermined processing condition using the cross-sectional shape of an unprocessed wafer and the predetermined processing condition, is under development.

Meanwhile, etching processing apparatuses have various specifications for processing spaces (e.g., processing chambers), and even with the same specification, the apparatuses may have different internal states due to, for example, mechanical differences between the apparatuses. Furthermore, an unprocessed wafer may be subjected to film formation under various film formation conditions, and even the same kind of films may have different elemental compositions, film densities, film structures, and the like. For this reason, it is not easy to establish a universal prediction model for a plurality of etching processing apparatuses as well as for all elemental compositions, film densities, and film structures of the same kind of films on an unprocessed wafer. In this regard, for example, when applying setting data and the like that has been searched using the prediction model, it is required to appropriately adjust the setting data and the like according to an etching processing apparatus and an unprocessed wafer of a specific application. See, for example, WO 2019/131608.

SUMMARY

An etching processing apparatus according to an aspect of the present disclosure has, for example, the following configuration. That is, the etching processing apparatus includes a storage configured to store a learned model of each group generated by each learning processing in a case where each processing condition acquired during execution of a specific step of an etching processing is classified into a plurality of groups according to a difference in effects when the specific step is executed, and the learning processing is performed for each group, an updating unit configured to update the learned model of a specific group when an effect executing the specific step on a test wafer using setting data included in a processing condition associated with the specific group is not equivalent to an effect associated with the specific group, and a searching unit configured to search for, using the updated learned model, setting data capable of obtaining the effect associated with the specific group when the specific step is executed on to the test wafer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a diagram illustrating a specific example of a plurality of data groups stored in a data storage.

FIG. 7 is a diagram illustrating a specific example of a classification processing.

FIG. 8 is a diagram illustrating a specific example of a Proxel generation processing.

DETAILED DESCRIPTION

Figure 1:
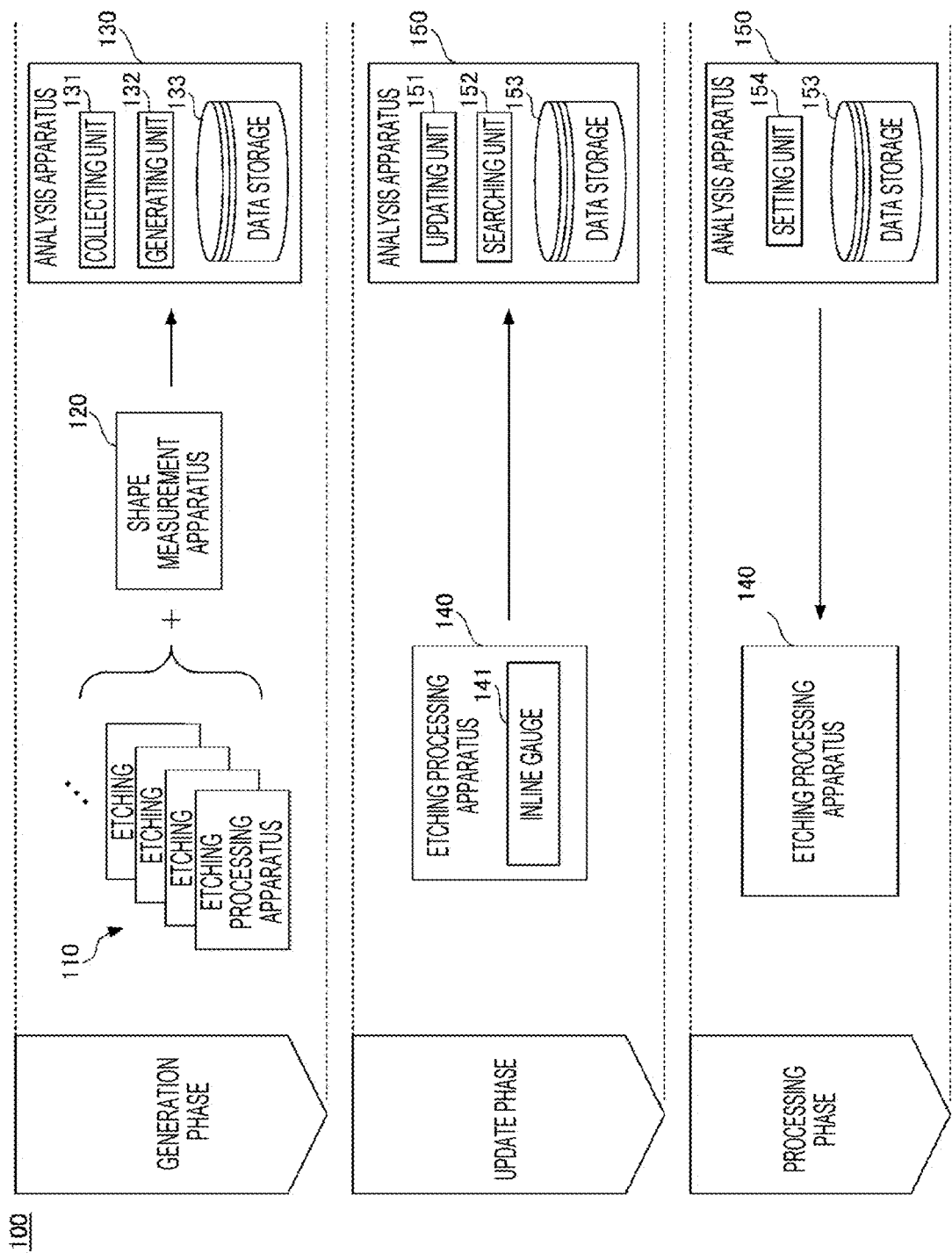
FIG. 1 is a diagram illustrating a system configuration and a processing outline in each phase of an etching processing system.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, each embodiment will be described with reference to the accompanying drawings. In this specification and the accompanying drawings, the same reference numerals will be given to components having substantially the same functional configuration, and redundant descriptions thereof will be omitted.

First Embodiment

<System Configuration and Processing Outline of Etching Processing System>

First, a system configuration in each phase and a processing outline in each phase of an etching processing system according to a first embodiment will be described. FIG. 1 is a diagram illustrating a system configuration and a processing outline in each phase of an etching processing system.

As illustrated in FIG. 1, in a "generation phase," the etching processing system 100 includes a plurality of etching processing apparatuses 110, one or more shape measurement apparatuses 120, and an analysis apparatus 130.

Each of the plurality of etching processing apparatuses 110 is an apparatus that performs an etching processing on a wafer. For example, the etching processing apparatuses 110 may be a plurality of etching processing apparatuses arranged respectively in a plurality of manufacturing places, or may be a plurality of etching processing apparatuses arranged collectively in the same manufacturing place. Further, the plurality of etching processing apparatuses 110 may be etching processing apparatuses having different specifications of processing spaces (chambers), or may be etching processing apparatuses having the same specification of processing spaces (chambers).

The shape measurement apparatus 120 is an apparatus that measures the cross-sectional shape of an unprocessed wafer and the cross-sectional shape of a processed wafer when an etching processing is performed in each of the plurality of etching processing apparatuses 110. Cross-sectional shape data of the unprocessed wafer and cross-sectional shape data of the processed wafer, measured by the shape measurement apparatus 120, are associated with a data group acquired during the etching processing, and are stored as an analysis target data group in a data storage 133 of the analysis apparatus 130.

The analysis apparatus 130 has a generation program installed therein, and by executing the program in the generation phase, the analysis apparatus 130 functions as a collecting unit 131 and a generating unit 132.

The collecting unit 131 of the analysis apparatus 130 collects, as an analysis target data group, the data group acquired during the etching processing and the associated cross-sectional shape data of the unprocessed wafer and the processed wafer, from the plurality of etching processing apparatuses 110 and the shape measurement apparatus 120. Further, the collecting unit 131 of the analysis apparatus 130 stores the collected analysis target data group in the data storage 133.

Further, the collecting unit 131 of the analysis apparatus 130 analyzes the analysis target data group stored in the data storage 133.

Specifically, the collecting unit 131 of the analysis apparatus 130 generates a Proxel by analyzing a plurality of data groups relating to the same step of the etching processing, included in the analysis target data group, and grouping the data groups that may obtain the same effect. In other words, the collecting unit 131 of the analysis apparatus 130 executes an "effect calculation processing" for calculating the effect of the etching processing, a "classification processing" for grouping the data groups, and a "Proxel generation processing" for generating the Proxel. Further, the collecting unit 131 of the analysis apparatus 130 stores the generated Proxel in the data storage 133.

In the present embodiment, the Proxel is a group of processing conditions that may obtain the same effect in relation to a change in the cross-sectional shape before and after a processing, and is a concept that represents the smallest data unit in the microfabrication of the etching processing. However, "the same effect" as used herein does not necessarily mean that a change in the cross-sectional shape is the same, but includes approximately the same change in the cross-sectional shape (within a predetermined range).

The generating unit 132 of the analysis apparatus 130 performs a learning processing for each generated Proxel using the cross-sectional shape data and processing conditions of the unprocessed wafer and the cross-sectional shape data of the processed wafer to generate a prediction model (learned model). In other words, the generating unit 132 of the analysis apparatus 130 executes a "prediction model generation processing."

Further, as illustrated in FIG. 1, in an "update phase," the etching processing system 100 includes an etching processing apparatus 140 and an analysis apparatus 150.

The etching processing apparatus 140 is an apparatus that performs an etching processing by applying setting data used for the generation of the prediction model. In the present embodiment, when applying the setting data, the setting data is appropriately adjusted in consideration of the followings:

differences in the specifications of the processing spaces between the etching processing apparatus 140 and the plurality of etching processing apparatuses 110;

mechanical differences of the apparatuses;

differences in the internal states of the processing space; and differences in the elemental composition, film density, and film structure of a target film to be etched.

For the adjustment of the setting data, an inline gauge 141 is arranged within the etching processing apparatus 140 to measure the cross-sectional shape of a test wafer before the etching processing and the cross-sectional shape of the test wafer after the etching processing. Further, cross-sectional shape data of the unprocessed test wafer and cross-sectional shape data of the processed test wafer, measured by the inline gauge 141, are processed by the analysis apparatus 150. A wafer, which depends on a processing wafer to be etched in the etching processing apparatus 140 (i.e., a wafer having substantially the same elemental composition, film density, and film structure as those of the target film to be etched), is used as the unprocessed test wafer.

The analysis apparatus 150 has an analysis program installed therein, and by executing the program in the update phase, the analysis apparatus 150 functions as an updating unit 151 and a searching unit 152.

The updating unit 151 of the analysis apparatus 150 collects the cross-sectional shape data of the unprocessed test wafer and the cross-sectional shape data of the processed test wafer, and updates model parameters of the prediction model. In other words, the updating unit 151 of the analysis apparatus 150 executes a "test wafer cross-sectional shape data collection processing" for collecting the cross-sectional shape data of the test wafer and a "prediction model update processing" for updating the prediction model.

The searching unit 152 of the analysis apparatus 150 searches for setting data for obtaining an associated effect using the updated prediction model having the updated model parameters, thereby adjusting the setting data used for the generation of the prediction model before the update. In other words, the searching unit 152 of the analysis apparatus 150 executes a "setting-data search processing" for searching for optimum setting data.

Further, as illustrated in FIG. 1, in a "processing phase," the etching processing system 100 includes the etching processing apparatus 140 and the analysis apparatus 150.

The etching processing apparatus 140 performs the etching processing on the unprocessed wafer under the setting data adjusted using the updated prediction model having the updated model parameters. The etching processing apparatus 140 in the processing phase is the same entity as the etching processing apparatus 140 in the update phase, but the inline gauge 141 is removed.

In the processing phase, the analysis apparatus 150 functions as a setting unit 154. The setting unit 154 of the analysis apparatus 150 sets, in the etching processing app`-`ratus 140, the setting data adjusted using the updated pre`-`diction model having the updated model parameters. In other words, the setting unit 154 of the analysis apparatus 150 executes a "setting-data setting processing" for setting the adjusted setting data.

In this way, according to the etching processing system 100, it is possible to adjust the setting data using the updated prediction model for each etching processing apparatus, and to perform the etching processing under the adjusted setting data.

In other words, according to the etching processing sys`-`tem 100, it is possible to provide a structure for adjusting the setting data for each individual etching processing appara`-`tus.

<Hardware Configuration of Analysis Apparatus>

Figure 2:
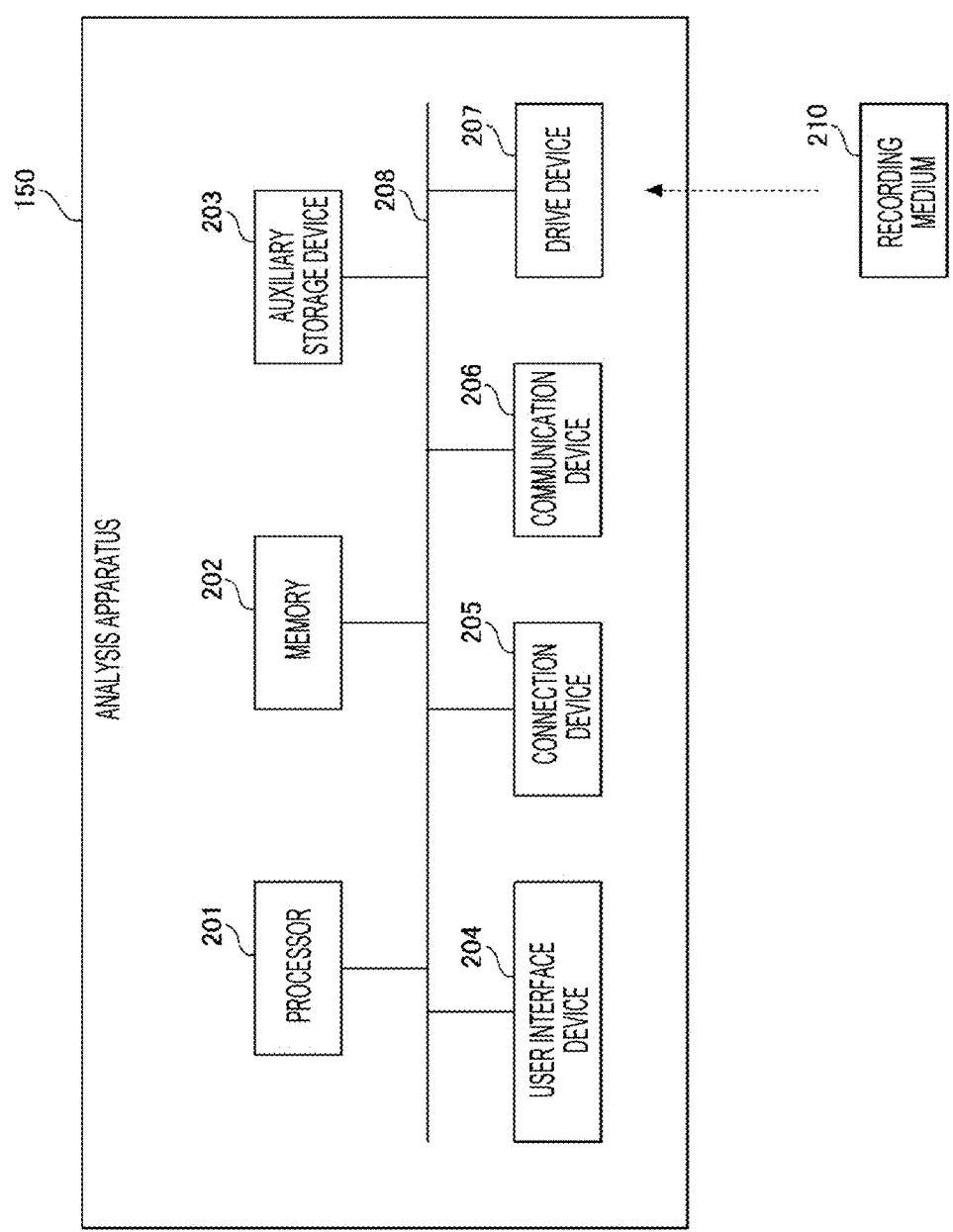
FIG. 2 is a diagram illustrating an example of a hardware configuration of an analysis apparatus.

Next, a hardware configuration of the analysis appara`-`tuses 130 and 150 will be described. FIG. 2 is a diagram illustrating an example of a hardware configuration of an analysis apparatus. Since the analysis apparatus 130 and the analysis apparatus 150 have the same hardware configura`-`tion, the hardware configuration of the analysis apparatus 150 will be described herein.

As illustrated in FIG. 2, the analysis apparatus 150 includes a processor 201, a memory 202, an auxiliary storage device 203, a user interface device 204, a connection device 205, a communication device 206, and a drive device 207. Each piece of hardware of the analysis apparatus 150 is interconnected via a bus 208.

The processor 201 includes various computing devices such as a central processing unit (CPU) and a graphics processing unit (GPU). The processor 201 reads various programs (e.g., analysis program) onto the memory 202 and executes them.

The memory 202 includes a main storage device such as a read only memory (ROM) and a random access memory (RAM). The processor 201 and the memory 202 form a so-called computer. The processor 201 executes various programs read onto the memory 202, so that the computer realizes various functions.

The auxiliary storage device 203 stores various programs and various data used when the various programs are executed by the processor 201.

The user interface device 204 includes, for example, a keyboard or touch panel used by the user of the analysis apparatus 150 to input various commands, and a display for displaying processing contents of the analysis apparatus 150.

The connection device 205 is connected to other appara`-`tuses (such as the etching processing apparatus 140) in the etching processing system 100. The communication device 206 is for communication with an external device (not illustrated) via a network.

The drive device 207 is a for setting up a recording medium 210. The recording medium 210 as used herein includes a medium such as a CD-ROM, flexible disk, or magneto-optical disk that optically, electrically, or magneti`-`cally records information. Further, the recording medium 210 may include a semiconductor memory for electrically recording information, such as a ROM or flash memory.

The various programs in the auxiliary storage device 203 are installed, for example, by setting up the distributed recording medium 210 in the drive device 207, and reading various programs recorded in the recording medium 210 by the drive device 207. Alternatively, the various programs in the auxiliary storage device 203 may be installed by down`-`loading them from a network via the communication device 206.

Specific Example of Processing in Generation Phase

Next, a specific example of a processing of the etching processing system 100 in the generation phase will be described.

(1) Specific Example of Analysis Target Data Group to be Collected

Figure 3:
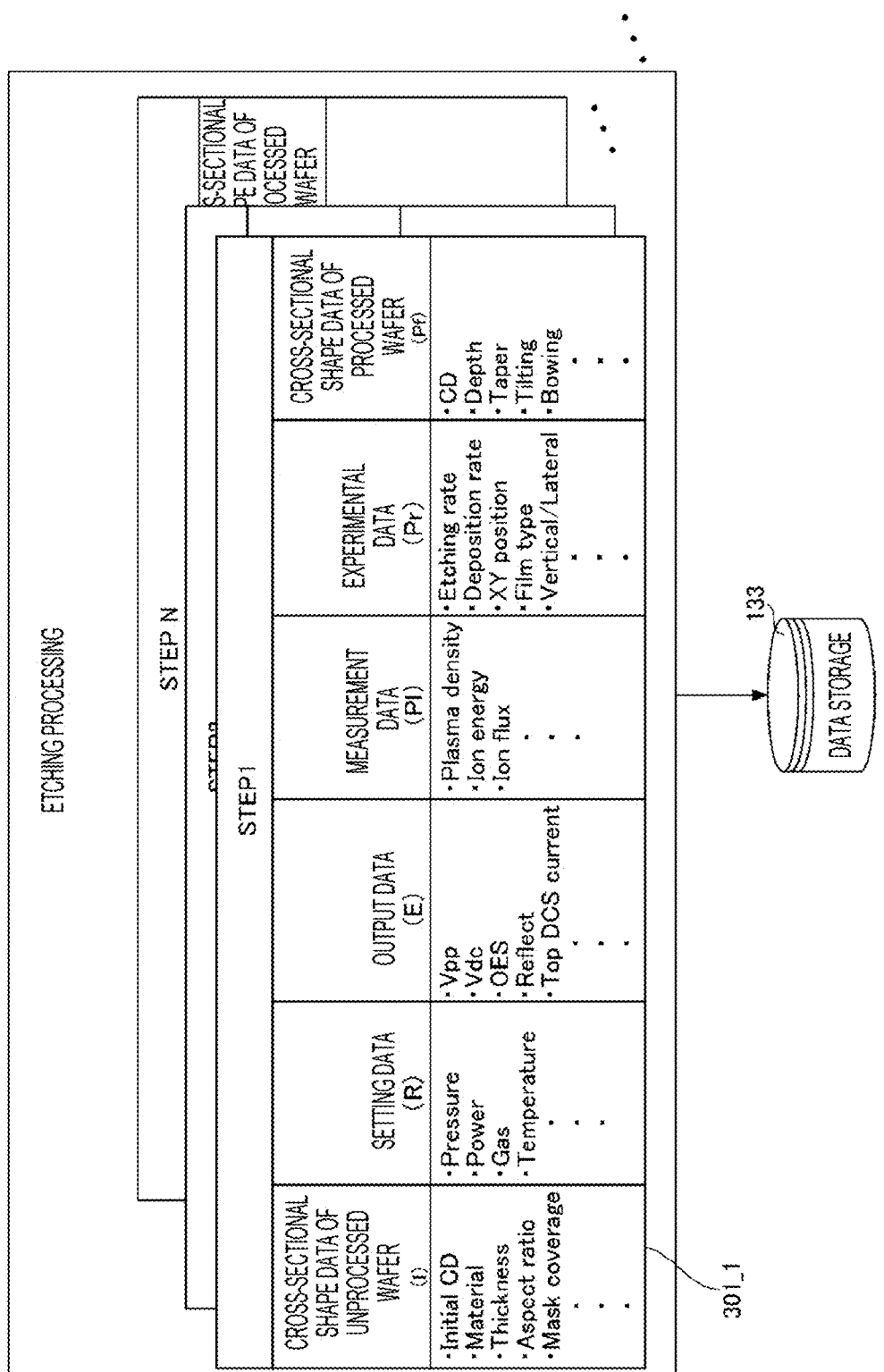
FIG. 3 is a diagram illustrating a specific example of a collected analysis target data group.

First, a specific example of the analysis target data group, which is collected by the collecting unit 131 and is stored in the data storage 133 in the generation phase, will be described. FIG. 3 is a diagram illustrating a specific example of a collected analysis target data group. As illustrated in FIG. 3, the etching processing, performed by each of the plurality of etching processing apparatuses 110, includes a plurality of steps (step name=STEP1 to STEP N). The "step" as used herein refers to the smallest processing unit that changes a state (e.g., attributes of the wafer, a state of the etching processing apparatus, and the atmosphere in the processing space) in the etching processing.

In FIG. 3, a data group 301_1 is, among collected analysis target data groups, is a data group associated with:

an etching processing by a predetermined etching pro`-`
    cessing apparatus among the plurality of etching pro`-`
    cessing apparatuses 110; and
a step of step name="STEP1" among a plurality of steps
    included in the etching processing.

As illustrated in FIG. 3, the data group 301_1 includes, as information items, "Cross-sectional shape data of the unpro`-`cessed wafer (I)," "Setting data (R)," "Output data (E)," "Measurement data (Pl)," "Experimental data (Pr)," and "Cross-sectional shape data of the processed wafer (Pf)."

The "Cross-sectional shape data of the unprocessed wafer (I)" includes the followings:

Initial critical dimensions (CD);
Material;
Thickness;
Aspect ratio; and
Mask coverage.

The "Setting data (R)" includes the followings:
Pressure (pressure inside the chamber);
Power (power of a radio-frequency power supply);
Gas (gas flow rate);
Temperature (temperature inside the chamber or the tem`-`
    perature of the wafer surface).

The "Output data (E)" includes the followings:
Vpp (potential difference);
Vdc (DC self-bias voltage);
OES (emission intensity by emission spectroscopic analy`-`
    sis);
Reflect (reflected wave power); and
Top DCS current (detected value by Doppler velocime`-`
    try).

The "Measurement data (Pl)" includes the followings:
Plasma density;
Ion energy; and
Ion flux.

The "Experimental data (Pr)" includes the followings:
Etching rate;
Deposition rate;
XY position (XY coordinates);

Film type (type of a thin film); and

Vertical/Lateral (classification of vertical/lateral types).

The "Cross-sectional shape data of the processed wafer (Pf)" includes the followings:

CD (critical dimension);

Depth;

Taper (taper angle);

Tilting (tilt angle); and

Bowing.

The data group 301_1 illustrated in FIG. 3 is an example, and the types of data included in each information item are not limited to those as illustrated. Further, the collected analysis target data group may include different information items and different types of data for each step.

(2) Outline of Analysis Result Data

Figure 4:
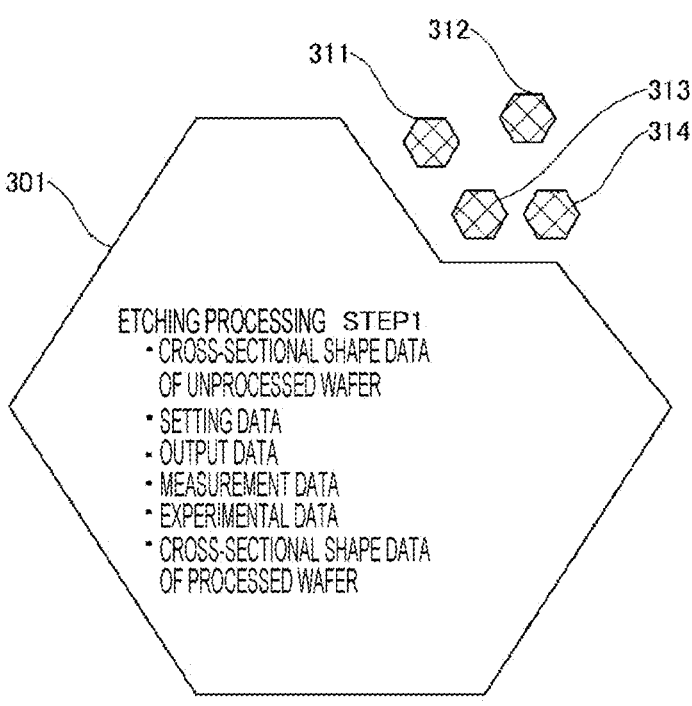
FIG. 4 is a diagram illustrating an outline of analysis result data.

Next, an outline of analysis result data, obtained by the collecting unit 131 analyzing the analysis target data group stored in the data storage 133, will be described. FIG. 4 is a diagram illustrating an outline of analysis result data.

In FIG. 4, a data group 301 is a data group of the step of step name="STEP1" of the etching processing, and includes a plurality of data groups (data groups 301_1, 301_2, ... ) collected from each of the plurality of etching processing apparatuses 110.

As described above, the collecting unit 131 analyzes a plurality of data groups of the same step, and groups data groups that may obtain the same effect. This is because even if the etching processing apparatus executes the same step, different results may be obtained due to different data included in the data group. Accordingly, the collecting unit 131 groups data groups that may obtain the same effect, and calculates the data range of each group allowed to obtain the same effect by calculating a processing condition specified by each group.

In FIG. 4, groups 311 to 314 are groups obtained by grouping the data groups that may obtain the same effect among the data groups 301. The processing condition (data range), specified by the group that may obtain the same effect in the same step of the etching processing, may be referred to as the smallest data unit that gives the same change in the "state" of the wafer in the etching processing. In other words, the processing condition (data range) specified by the group may be referred to as the smallest data unit for the microfabrication of the etching processing.

As described above, the smallest data unit (Process Element) for the microfabrication of the etching processing is referred to as the "Proxel" in the present embodiment.

The collecting unit 131 of the analysis apparatus 130 generates the "Proxel" by analyzing the collected analysis target data group, and stores it as analysis result data in the data storage 133.

(3) Specific Example of Effect Calculation Processing

Figure 5:
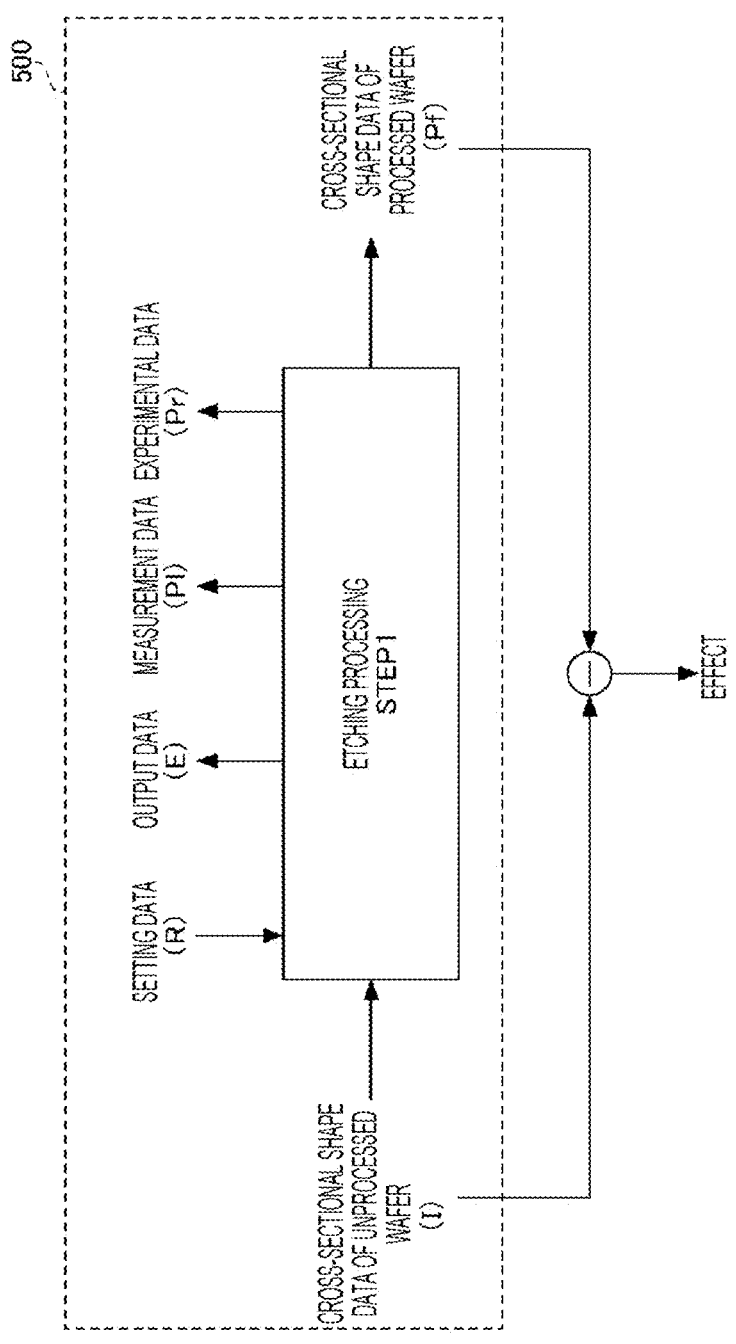
FIG. 5 is a diagram illustrating a specific example of an effect calculation processing.

Next, the effect calculation processing when the collecting unit 131 analyzes the analysis target data group stored in the data storage 133 and generates the Proxel as the analysis result data will be described. FIG. 5 is a diagram illustrating a specific example of an effect calculation processing.

As illustrated in FIG. 5, a relationship between a predetermined step (step name="STEP1") of the etching processing and the data group 301 may be schematically represented by a dotted line 500.

That is, when a predetermined etching processing apparatus for which setting data is set executes a predetermined step of the etching processing, a state before execution (any one of attributes of the wafer before execution, a state of the predetermined etching processing apparatus, and the atmosphere in the processing space) changes after execution. Then, a processing condition of the etching processing at this time may be specified by output data, measurement data, and experimental data.

That is, under the processing condition specified by the setting data, output data, measurement data, and experimental data, the effect of the predetermined step of the etching processing may be represented by the difference between data indicating the state before execution (in the present embodiment, the cross-sectional shape data of the unprocessed wafer), and data indicating the state after execution (in the present embodiment, the cross-sectional shape data of the processed wafer).

Thus, the collecting unit 131 calculates the effect under each processing condition in the step by calculating the difference between the cross-sectional shape data of the unprocessed wafer and the cross-sectional shape data of the processed wafer, which is associated with each data group for each step. Further, the collecting unit 131 associates the calculated effect with the setting data, output data, measurement data, and experimental data, and stores them as a plurality of data groups (including the calculated effect) in the data storage 133.

FIG. 6 is a diagram illustrating a specific example of a plurality of data groups stored in the data storage, and is an example of a plurality of data groups (including the calculated effect) stored in the data storage 133 by the collecting unit 131 with respect to the step of step name="STEP1" of the etching processing.

As illustrated in FIG. 6, the plurality of data groups (including the calculated effect) stored in the data storage 133 includes, as information items, "Data group identifier," "Setting data (R)," "Output data (E)," "Measurement data (Pl)," "Experimental data (Pr)," and "Effect."

The "data group identifier" is an identifier for identifying each data group. In FIG. 6, a data group identifier="Data001" is, for example, a data group of a predetermined step (step name="STEP1") of the etching processing collected from a predetermined etching processing apparatus and an effect thereof. Further, a data group identifier="Data002" is, for example, a data group including a data group of the predetermined step (step name="STEP1") of the etching processing collected from another etching processing apparatus and an effect thereof.

Each information item from the "Setting data (R)" to the "Experimental data (Pr)" stores the data groups other than the cross-sectional shape data of the unprocessed wafer (I) and the cross-sectional shape data of the processed wafer (Pf) among the analysis target data group (see FIG. 3).

The "Effect" stores the calculated effect. According to the example of FIG. 6, in a case of the step of step name="STEP1" of the etching processing, "Effect <1>" may be obtained under a processing condition specified by the setting data associated with the data group identifier="Data001". Similarly, in a case of the step of step name="STEP1" of the etching processing, "Effect <2>" may be obtained under a processing condition specified by the setting data associated with the data group identifier="Data002".

(4) Specific Example of Classification Processing

Next, a processing for classifying a plurality of data groups (including the calculated effect) stored in the data storage 133 by the collecting unit 131 will be described. FIG. 7 is a diagram illustrating a specific example of a classification processing.

As illustrated in FIG. 7, the plurality of data groups (including the calculated effect) stored in the data storage 133 are plotted in a feature space 700. In FIG. 7, the solid-line circle with the number indicates one of a plurality of read data groups (including the calculated effect), and the number written in the solid-line circle indicates a data group identifier of the data group.

In the example of FIG. 7, the feature space 700 is two-dimensional for the simplicity of description (that is, two types of data (Data type p and Data type q) included in the data group are plotted).

In FIG. 7, the dotted-line circle enclosing the solid-line circle indicates a state of grouping data groups that may obtain the same effect. That is, all data groups identified by data group identifiers written in the solid-line circles included within the dotted-line circle are data groups having the same effect in the step of step name="STEP1" of the etching processing.

For example, a dotted-line circle 701 includes data group identifiers="Data001", "Data004", and "Data010". The respective solid-line circles with these written data group identifiers are distributed at positions close to each other in the feature space 700, but do not completely overlap each other. That is, the data groups identified by the respective data group identifiers are similar to each other, but do not exactly identical.

Meanwhile, all of these data groups are data groups that may obtain Effect <1> in the step of step name="STEP1" of the etching processing. In other words, the plurality of data groups grouped by the dotted-line circle 701 in the feature space 700 are data groups that may obtain Effect <1> even if STEP1 of the etching processing is executed under any data group.

Further, in FIG. 7, a dotted-line circle 702 includes data group identifiers="Data005", "Data006", and "Data007", and a dotted-line circle 703 includes the data group identifier="Data002". Each data group included in the dotted-line circle 702 and the data group included in the dotted-line circle 703 are distributed at positions far away from each other.

Meanwhile, all the data groups, identified by the data group identifiers written in the respective solid-line circles included in the dotted-line circle 702, are data groups that may obtain Effect <2> when STEP1 of the etching processing is executed under each data group. Similarly, the data group identified by the data group identifier written in the solid-line circle included in the dotted-line circle 703 is a data group that may obtain Effect <2> when STEP1 of the etching processing is executed under the data group.

Here, when grouping the dotted-line circle 702 and the dotted-line circle 703 into one dotted-line circle, the resulting dotted-line circle will overlap with the dotted-line circle 701. For this reason, in the present embodiment, even if data groups may obtain the same effect, they are grouped separately (that is, when the feature space is divided, data groups are grouped such that data groups associated with different effects are not mixed in the same area).

In FIG. 7, reference numeral 710 schematically represents each group after grouping, to which a Proxel name is attached.

(5) Specific Example of Proxel Generation Processing

Next, a specific example of a Proxel generation processing by the collecting unit 131 will be described. FIG. 8 is a diagram illustrating a specific example of a Proxel generation processing.

As illustrated in FIG. 8, each data range of each area in the feature space is calculated by calculating the minimum and maximum values for each data included in each data group obtained after grouping into the same group.

The example of FIG. 8 illustrates that data groups that may obtain the same effect as Effect <1> are grouped into a group of group name="Group Gr1". Further, the example of FIG. 8 illustrates that, among each data included in the data groups grouped into the group of group name="Group Gr1," "Pressure" of the setting data were as follows:

the minimum value="Pressure_1";

the maximum value="Pressure_4".

Specifically, each data range of the area of the feature space in which the data groups, grouped into the group of group name="Group Gr1", are distributed may be represented by a dotted line 800. It is clear that each data range indicated by the dotted line 800 is a Proxel (processing condition specified by the group 311, referred to as "ProxelA") described in FIG. 3.

In this way, the collecting unit 131 may generate a Proxel as analysis result data by analyzing an analysis target data group.

(6) Specific Example of Prediction Model Generation Processing

Figure 9:
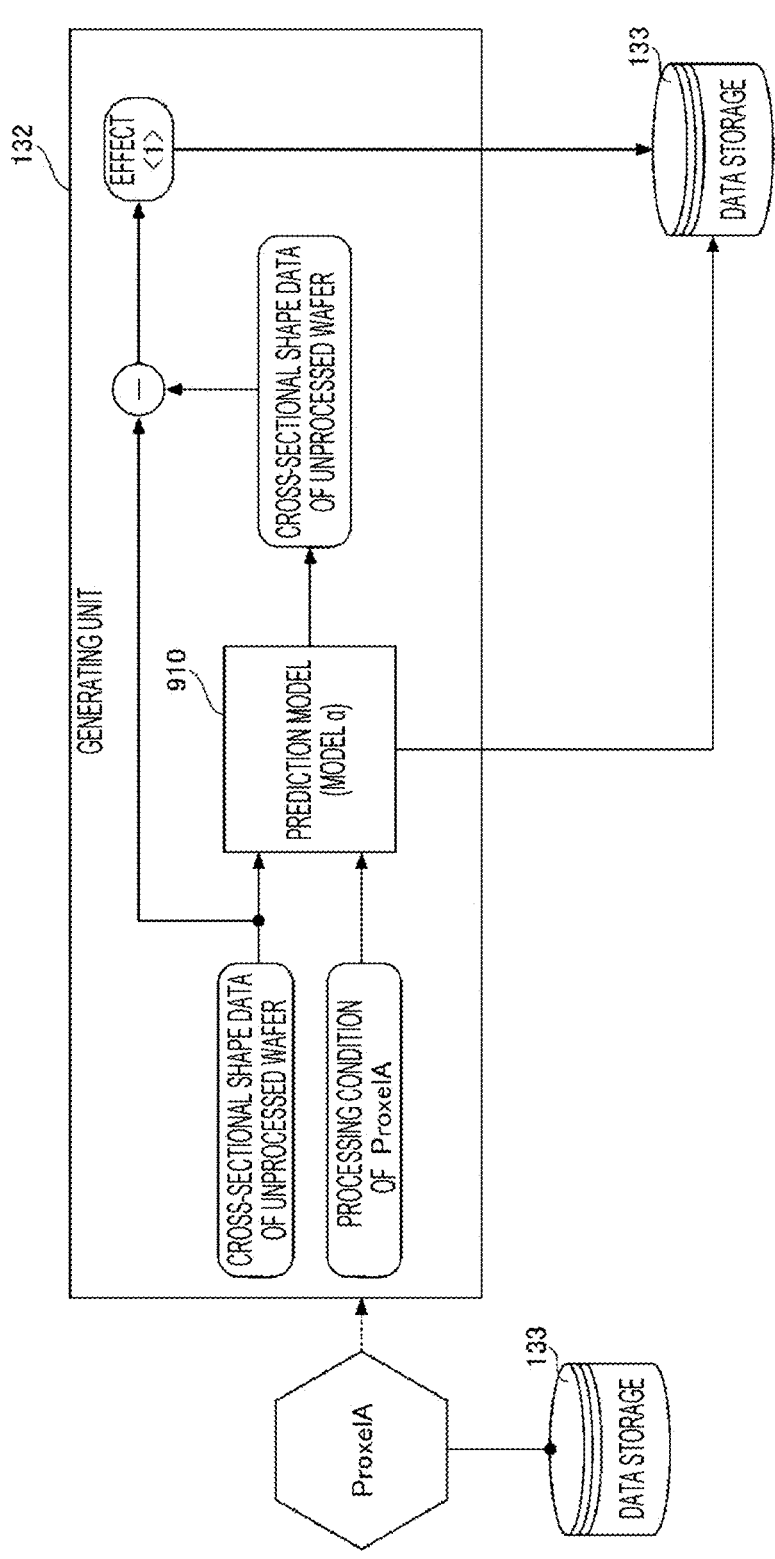
FIG. 9 is a diagram illustrating a specific example of a prediction model generation processing.

Next, a specific example of a prediction model generation processing performed by the generating unit 132 using a processing condition specified by a Proxel generated as analysis result data will be described. FIG. 9 is a diagram illustrating a specific example of a prediction model generation processing.

The generating unit 132 reads, from the data storage 133, the followings:

the cross-sectional shape data of the unprocessed wafer;

processing condition specified by an associated Proxel (processing condition specified by "ProxelA" in the example of FIG. 9); and the cross-sectional shape data of the processed wafer.

Further, the generating unit 132 inputs, as input data, the read cross-sectional shape data of the unprocessed wafer and the processing condition specified by "ProxelA" to a prediction model 910 (model name=model α). Further, the generating unit 132 performs a learning processing for updating model parameters of the prediction 910 so that output data from the prediction model 910 approaches the cross-sectional shape data of the processed wafer, which is correct data. Furthermore, the generating unit 132 stores, in the data storage 133, the learned model (prediction model 910) or model parameters generated by performing the learning processing.

In a state where the learning processing by the generating unit 132 is completed, when comparing the cross-sectional shape data of the processed wafer, which is inferred by the prediction model 910 by inputting, to the prediction model 910, the followings:

the cross-sectional shape data of the unprocessed wafer, which is not used for the learning processing;

the processing condition specified by "ProxelA," and with the input cross-sectional shape data of the unprocessed wafer, the difference between the two is equal to Effect <1>.

Effect <1> calculated by the generating unit 132 of the analysis apparatus 130 is stored in the data storage 133.

Specific Example of Processing in Update Phase

Next, a specific example of a processing of the etching processing system 100 in the update phase will be described.

Figure 10:
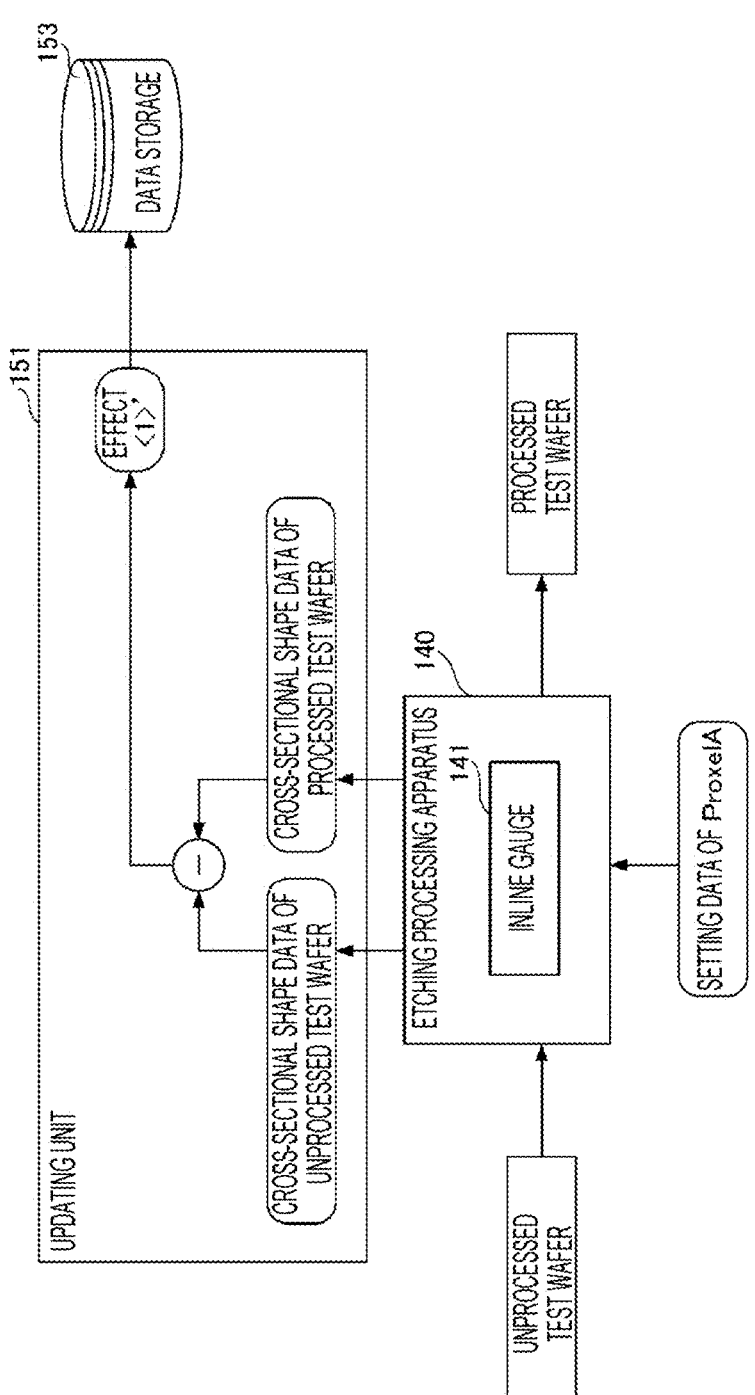
FIG. 10 is a diagram illustrating a specific example of a test wafer cross-sectional shape data collection processing.

(1) Specific Example of Test Wafer Cross-Sectional Shape Data Collection Processing First, a specific example of a test wafer cross-sectional shape data collection processing by the updating unit 151 of the analysis apparatus 150 will be described. FIG. 10 is a diagram illustrating a specific example of a test wafer cross-sectional shape data collection processing. As described above, in the update phase, the inline gauge 141 is arranged within the etching processing apparatus 140.

The inline gauge 141 measures the cross-sectional shape of the unprocessed test wafer before the etching processing is performed by the etching processing apparatus 140, and outputs the cross-sectional shape data of the unprocessed test wafer.

Further, the inline gauge 141 measures the cross-sectional shape of the processed test wafer after the etching processing is performed by the etching processing apparatus 140 under the setting data included in the processing condition specified by "ProxelA.". Further, the inline gauge 141 outputs the measured cross-sectional shape data of the processed test wafer.

The updating unit 151 of the analysis apparatus 150 collects the followings output from the inline gauge 141:

the cross-sectional shape data of the unprocessed test wafer; and the cross-section shape data of the processed test wafer, and Effect <1>' is calculated based on the difference between the two. At this time, the reason why the effect calculated by the updating unit 151 of the analysis apparatus 150 is not equal to Effect <1> is because of differences in the specifications of the processing spaces (chambers) between:

the etching processing apparatus 140, and the plurality of etching processing apparatuses 110 used in the learning processing of the prediction model 910, mechanical differences of the apparatuses, differences in the internal states of the processing spaces, and differences in the elemental composition, film density, and film structure of the target film to be etched.

Effect <1>' calculated by the updating unit 151 of the analysis apparatus 150 is stored in the data storage 153.

(2) Specific Example of Prediction Model Update Processing

Figure 11:
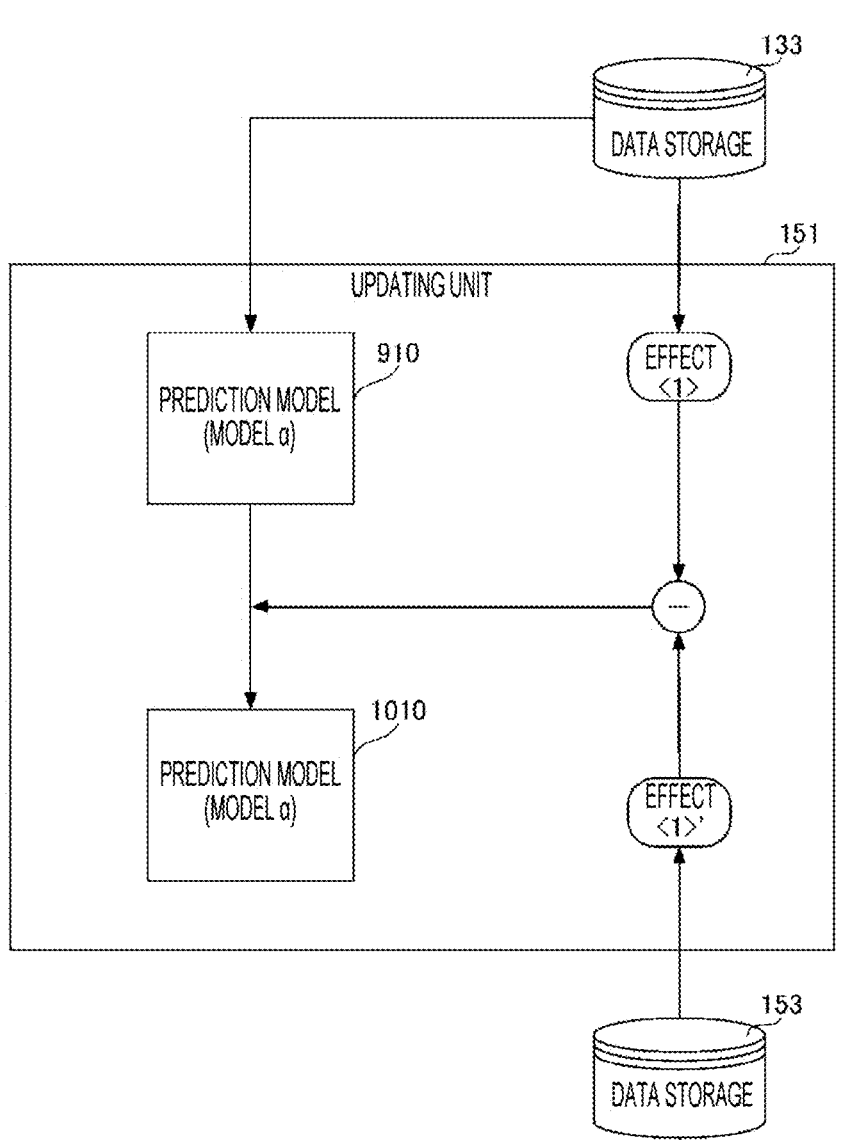
FIG. 11 is a diagram illustrating a specific example of a prediction model update processing.

Next, a specific example of an update processing of the prediction model 910 by the updating unit 151 of the analysis apparatus 150 will be described. FIG. 11 is a diagram illustrating a specific example of a prediction model update processing.

The updating unit 151 of the analysis apparatus 150 acquires the followings:

Effect<1> calculated in a state of the learning processing of the prediction model 910 being completed, and stored in the data storage 133 in the generation phase; and Effect <1>' calculated by etching the unprocessed test wafer and stored in the data storage 153 in the update phase.

Further, the updating unit 151 of the analysis apparatus 150 reads the prediction model 910 or model parameters of the prediction model 910 stored in the data storage 133.

Furthermore, the updating unit 151 of the analysis apparatus 150 updates the read model parameters of the prediction model 910 and generates a prediction model 1010 based on the difference between the acquired Effect <1> and Effect <1>'.

(3) Specific Example of Setting-Data Search Processing

Figure 12:
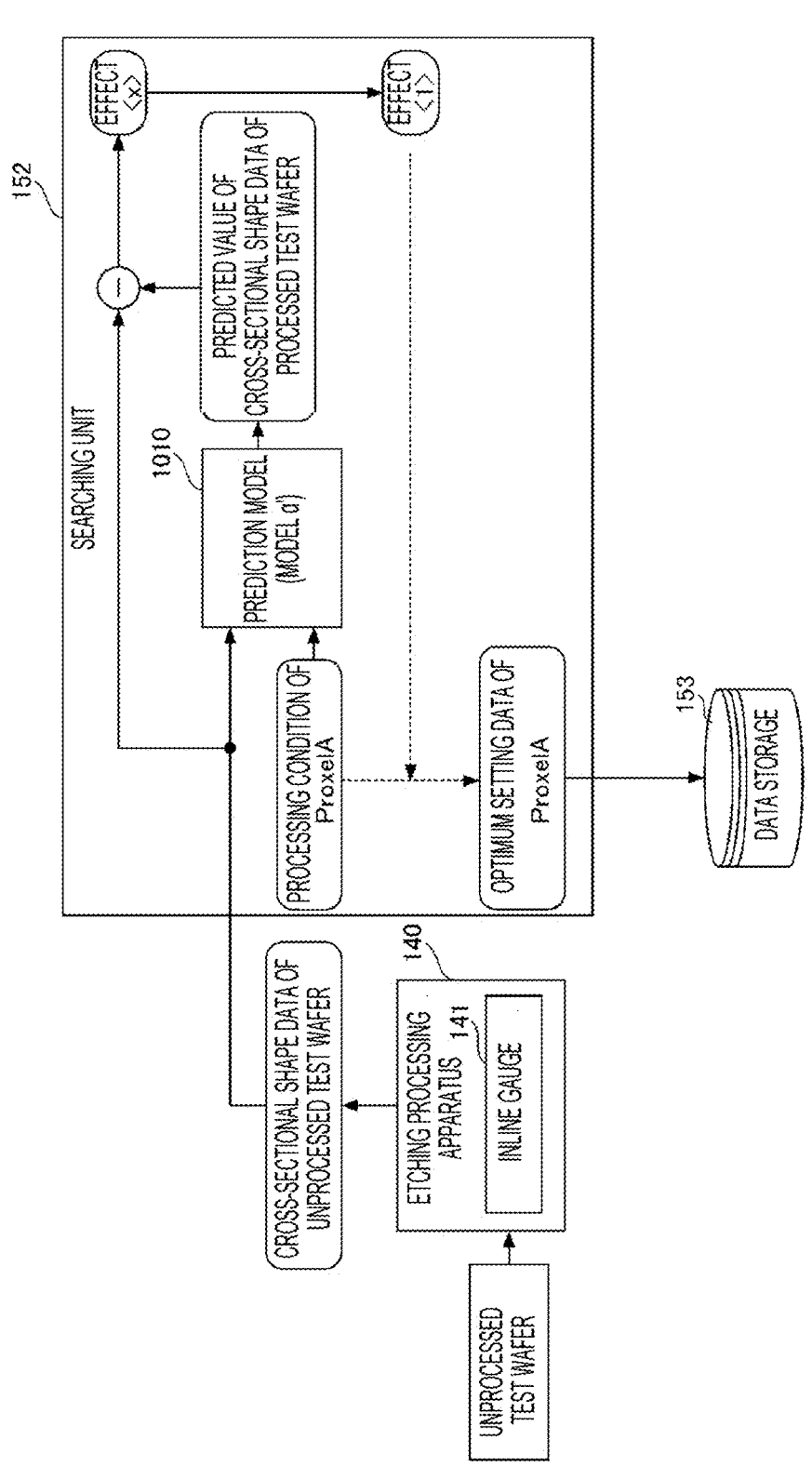
FIG. 12 is a diagram illustrating a specific example of a setting-data search processing.

Next, a specific example of a setting-data search processing by the searching unit 152 of the analysis apparatus 150 will be described. FIG. 12 is a diagram illustrating a specific example of a setting-data search processing.

As illustrated in FIG. 12, the searching unit 152 of the analysis apparatus 150 has the generated prediction model 1010. Further, the searching unit 152 of the analysis apparatus 150 acquires a predicted value of the cross-sectional shape data of the processed test wafer output from the prediction model 1010 by inputting, to the prediction model 1010, the followings:

the cross-sectional shape data of the unprocessed test wafer; and the processing condition specified by "ProxelA."

Further, the searching unit 152 of the analysis apparatus 150 calculates Effect <x> by calculating the difference between the cross-sectional shape data of the unprocessed test wafer and the predicted value of the cross-sectional shape data of the processed test wafer.

Further, the searching unit 152 of the analysis apparatus 150 adjusts the setting data included in the processing condition input to the prediction model 1010 so that the calculated Effect <x> approaches Effect <1>. Thus, the searching unit 152 may obtain optimum setting data in which the calculated Effect <x> is identical to Effect <1>.

Specific Example of Processing in Processing Phase

Next, a specific example of a processing of the etching processing system 100 in the processing phase will be described.

(1) Specific Example of Setting-Data Setting Processing

Figure 13:
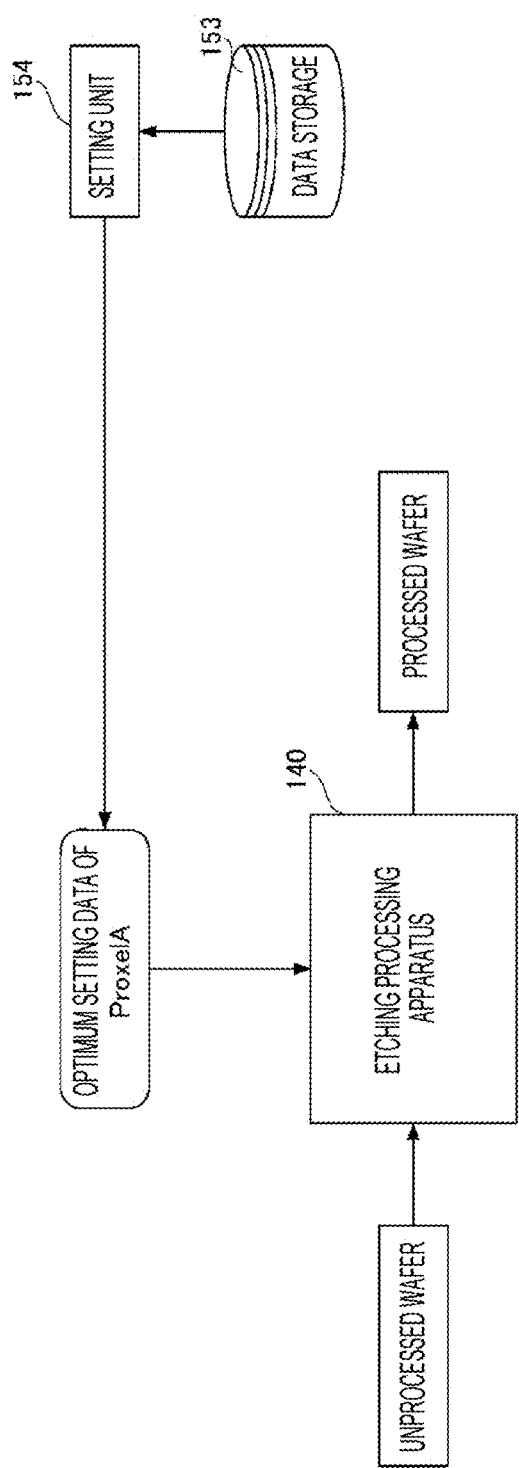
FIG. 13 is a diagram illustrating a specific example of a setting-data setting processing.

Next, a specific example of a setting-data setting processing by the setting unit 154 of the analysis apparatus 150 will be described. FIG. 13 is a diagram illustrating a specific example of a setting-data setting processing. As illustrated in FIG. 13, the setting unit 154 reads optimum setting data adjusted by the searching unit 152, and sets it in the etching processing apparatus 140.

As a result, the etching processing apparatus 140 obtains Effect <1> by performing the etching processing under the setting data in which the followings are appropriately adjusted:

differences in the specifications of the processing spaces between the etching processing apparatus 140 and the plurality of etching processing apparatuses 110;

mechanical differences of the apparatus;

differences in the internal states of the processing spaces; and differences in the elemental composition, film density, and film structure of the target film to be etched.

<Flow of Analysis Processing>

Figure 14:
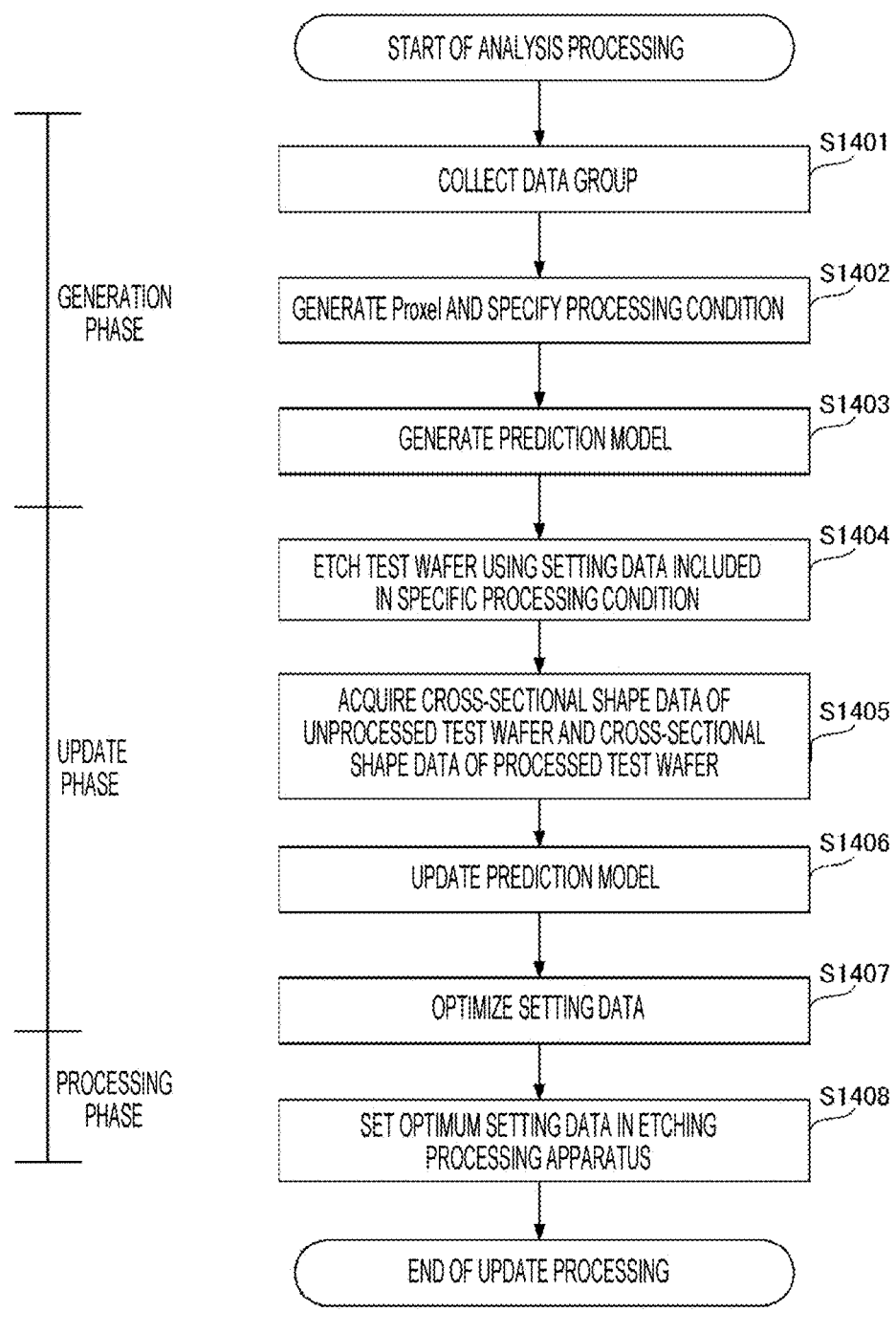
FIG. 14 is an example of a flowchart illustrating a flow of an analysis processing.

Next, a flow of an analysis processing by the etching processing system 100 will be explained. FIG. 14 is an example of a flowchart illustrating a flow of an analysis processing.

As illustrated in FIG. 14, in step S1401 of the generation phase, the analysis apparatus 130 collects an analysis target data group for generating a prediction model.

In step S1402, the analysis apparatus 130 generates a Proxy and specifies a processing condition based on the collected analysis target data group.

In step S1403, the analysis apparatus 130 performs a learning processing using the cross-sectional shape data and processing condition of the unprocessed wafer and the cross-sectional shape data of the processed wafer to generate a prediction model. Further, the analysis apparatus 130 calculates Effect <1> using the generated prediction model.

Subsequently, in step S1404 of the update phase, the etching processing apparatus 140 performs an etching processing on the unprocessed test wafer under the setting data included in the generated processing condition.

In step S1405, the analysis apparatus 150 acquires the cross-sectional shape data of the unprocessed test wafer and the cross-sectional shape data of the processed test wafer, measured by the inline gauge 141 when the etching processing was performed, and calculates Effect <1>'.

In step S1406, the analysis apparatus 150 updates model parameters of the prediction model based on the difference between the calculated Effect <1> and Effect <1>'.

In step S1407, the analysis apparatus 150 searches for optimum setting data by adjusting the setting data based on the updated prediction model having the updated model parameters.

In step S1408 of the processing phase, the analysis apparatus 150 sets the optimum setting data in the etching processing apparatus 140. Thus, the etching processing apparatus 140 performs the etching processing under the optimum setting data, and obtains Effect <1>.

<Summary>

As is clear from the above description, the etching processing system 100 according to the first embodiment operates to:

classify each processing condition, acquired when executing a specific step of an etching processing, into a plurality of groups according to differences in effects when executing the specific step, and perform a learning processing for each group to generate a prediction model (learned model) of each group;

use, as an unprocessed test wafer, a wafer depending on a processing wafer to be etched in an etching processing apparatus (i.e., a wafer having substantially the same elemental composition, film density, and film structure as those of a target film to be etched);

update the prediction model of a specific group when an effect in a case of executing, with respect to the unprocessed test wafer, the specific step using setting data included in a processing condition associated with the specific group is not equivalent to an effect associated with the specific group;

search for, using the updated prediction model, setting data that may obtain the effect associated with the specific group when executing the specific step with respect to the unprocessed test wafer; and set the searched setting data with respect to the processing wafer when executing the specific step.

In this way, with the etching processing system 100 according to the first embodiment, it is possible to adjust the setting data using the updated prediction model for each etching processing apparatus, and to perform the etching processing under the adjusted setting data.

In other words, with the etching processing system 100 according to the first embodiment, it is possible to provide a structure for adjusting the setting data for each etching processing apparatus.

Second Embodiment

The first embodiment has described a case where the setting data is adjusted by inputting, as an initial value, the processing condition specified by "ProxelA" to the prediction model when searching for the setting data using the updated prediction model.

However, the method of searching for the setting data is not limited to this, and the setting data may be searched from 1 by inputting a processing condition other than the processing condition specified by "ProxelA" as the initial value.

In other words, with the etching processing system 100 according to a second embodiment, it is possible to provide a structure for generating the setting data for each etching processing apparatus.

Third Embodiment

The first and second embodiments have described a case where the Proxel is generated with respect to the specific step (step name="STEP1") of the etching processing, but the Proxel is also generated by the same method with respect to other steps of the etching processing.

Further, in the first and second embodiments, the test wafer cross-sectional shape data collection processing and the prediction model update processing are executed with respect to a specific Proxel ("ProxelA"), but they are equally executed with respect to all generated Proxels.

Further, the first and second embodiments have described a case where the updating unit 151 and the searching unit 152 are realized in the analysis apparatus 150, but some functions of the analysis apparatus 150 may be realized in the etching processing apparatus 140.

Further, in the first and second embodiments, the etching processing apparatus 140 and the analysis apparatus 150 are configured as separate ones, but the etching processing apparatus 140 and the analysis apparatus 150 may be integrated.

Further, in the first and second embodiments, a configuration of the etching processing apparatus 140 has not been mentioned, but the etching processing apparatus 140 may be constituted by a plurality of components (e.g., ancillary mechanisms such as a transfer mechanism in addition to the processing space). Further, in a case where the etching processing apparatus 140 is constituted by the plurality of components, some functions of the analysis apparatus 150 may be realized by any component in the etching processing apparatus 140.

Further, in the first and second embodiments, the analysis apparatus 130 and the analysis apparatus 150 are configured as separate ones, but the analysis apparatus 130 and the analysis apparatus 150 may be integrated. In this case, a generation program is included in an analysis program and is executed as a part of the analysis program.

Further, in the first and second embodiments, the analysis apparatus 150 has been described as an entity and executing an analysis program. However, the analysis apparatus 150 may be constituted by, for example, a plurality of computers and each computer may install an analysis program therein, so that the analysis program may be executed in the form of distributed computing.

Further, in the first and second embodiments, a method of downloading and installing the analysis program via a network has been mentioned as an example of a method of installing the analysis program in the auxiliary storage device 203 of the analysis apparatus 150. At this time, no particular reference was made to a download source, but in the case of installation by such a method, the download source may be, for example, a server device that stores the analysis program in an accessible manner. Further, the server device may be a cloud-based device that accepts access from the analysis apparatus 150 via a network and downloads the analysis program on condition of charging. In other words, the server device may be a cloud-based device that provides an analysis program providing service.

For example, the embodiments of the present disclosure include the following aspects.

APPENDIX 1

An etching processing apparatus including:
a storage configured to store a learned model of each group generated by each learning processing in a case where each processing condition acquired during execution of a specific step of an etching processing, is classified into a plurality of groups according to a difference in effects when the specific step is executed, and the learning processing is performed for each group;
an updating unit configured to update the learned model of a specific group when an effect of executing the specific step on a test wafer using setting data included in a processing condition associated with the specific group is not equivalent to an effect associated with the specific group;
a searching unit configured to search for, using the updated learned model, setting data capable of obtaining the effect associated with the specific group when the specific step is executed on the test wafer; and
a setting unit configured to set the searched setting data when the specific step is executed on a processing wafer.

APPENDIX 2

The etching processing apparatus according to Appendix 1, in which the learned model is learned such that output data when inputting cross-sectional shape data of the wafer before executing the specific step and the processing condition associated with the specific group, approaches cross-sectional shape data of the wafer after executing the specific step.

APPENDIX 3

The etching processing apparatus according to Appendix 1 or 2, in which the updating unit updates a model parameter of the learned model of the specific group such that the effect associated with the specific group is equivalent to the effect of executing the specific step on the test wafer using the setting data included in the processing condition associated with the specific group.

APPENDIX 4

The etching processing apparatus according to any one of Appendixes 1 to 3, further including a gauge configured to measure the cross-sectional shape data of the test wafer before and after executing the specific step on the test wafer using the setting data included in the processing condition associated with the specific group,
in which the effect of executing the specific step on the test wafer using the setting data included in the processing condition associated with the specific group is calculated based on the cross-sectional shape data of the test wafer before executing the specific step and the cross-sectional shape data of the test wafer after executing the specific step.

APPENDIX 5

The etching processing apparatus according to any one of Appendixes 1 to 4, in which the searching unit searches for the setting data such that an effect, calculated based on a predicted value of the cross-sectional shape data of the test wafer after processing in a case of inputting the cross-sectional shape data of the test wafer before processing, to the updated learned model and the cross-sectional shape data of the test wafer before processing, approaches the effect associated with the specific group.

APPENDIX 6

The etching processing apparatus according to any one of Appendixes 1 to 5, wherein the test wafer has substantially the same elemental composition, film density, and film structure of a target film to be etched as the processing wafer.

APPENDIX 7

An etching processing system including:
a storage configured to store a learned model of each group generated by each learning processing in a case where each processing condition acquired during execution of a specific step of an etching processing, is classified into a plurality of groups according to a difference in effects when the specific step is executed, and the learning processing is performed for each group;
an updating unit configured to update the learned model of a specific group when an effect of executing the specific step on a test wafer using setting data included in a processing condition associated with the specific group is not equivalent to an effect associated with the specific group;
a searching unit configured to search for, using the updated learned model, setting data capable of obtaining the effect associated with the specific group when the specific step is executed on the test wafer; and
a setting unit configured to set the searched setting data when the specific step is executed on a processing wafer.

APPENDIX 8

An analysis apparatus comprising:
a storage configured to store a learned model of each group generated by each learning processing in a case where each processing condition acquired during execution of a specific step of an etching processing, is classified into a plurality of groups according to a difference in effects when the specific step is executed, and the learning processing is performed for each group;

an updating unit configured to update the learned model of a specific group when an effect of executing the specific step on a test wafer using setting data included in a processing condition associated with the specific group is not equivalent to an effect associated with the specific group; and a searching unit configured to search for, using the updated learned model, setting data capable of obtaining the effect associated with the specific group when the specific step is executed on the test wafer.

APPENDIX 9

An etching processing method comprising:

storing a learned model of each group generated by each learning processing in a case where each processing condition acquired during execution of a specific step of an etching processing, is classified into a plurality of groups according to a difference in effects when the specific step is executed, and the learning processing is performed for each group;

updating the learned model of a specific group when an effect of executing the specific step on a test wafer using setting data included in a processing condition associated with the specific group is not equivalent to an effect associated with the specific group;

searching for, using the updated learned model, setting data capable of obtaining the effect associated with the specific group when the specific step is executed on the test wafer; and setting the searched setting data when the specific step is executed on a processing wafer.

APPENDIX 10

An analysis program that causes a computer of an analysis apparatus including a storage, configured to store a learned model of each group generated by each learning processing in a case where each processing condition acquired during execution of a specific step of an etching processing, is classified into a plurality of groups according to a difference in effects when the specific step is executed, and the learning processing is performed for each group, to execute a process including updating the learned model of a specific group when an effect of executing the specific step on a test wafer using setting data included in a processing condition associated with the specific group is not equivalent to an effect associated with the specific group, and searching for, using the updated learned model, setting data capable of obtaining the effect associated with the specific group when the specific step is executed on the test wafer.

According to the present disclosure, it is possible to provide a structure for generating or adjusting setting data for each etching processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching processing apparatus, comprising:

a memory to store a learned model of each group generated by each learning processing in a case where each processing condition acquired during execution of a specific step of an etching processing is classified into a plurality of groups according to a difference in effects when the specific step is executed, and the learning processing is performed for each group;

a gauge to measure cross-sectional shape data of a wafer; and processing circuitry configured to execute instructions stored in the memory to:

update the learned model of a specific group when an effect calculated based on the cross-sectional shape data of the wafer measured by the gauge before and after executing the specific step using setting data included in a processing condition associated with the specific group is not equivalent to an effect associated with the specific group, wherein the effect associated with the specific group represents a change in cross-sectional shape data; and search for, using the learned model updated by the processing circuitry, setting data which results in the effect associated with the specific group when the specific step is executed on the wafer.

2. The etching processing apparatus according to claim 1, wherein the processing circuitry is further configured to set the setting data when the specific step is executed on the wafer.

3. The etching processing apparatus according to claim 2, wherein the learned model is learned such that output data, when inputting cross-sectional shape data of the wafer before executing the specific step and the processing condition associated with the specific group, approaches cross-sectional shape data of the wafer after executing the specific step.

4. The etching processing apparatus according to claim 3, wherein the processing circuitry updates a model parameter of the learned model of the specific group such that the effect calculated based on the cross-sectional shape data is equivalent to the effect associated with the specific group.

5. The etching processing apparatus according to claim 1, wherein the processing circuitry searches for the setting data such that an effect calculated based on a predicted value of the cross-sectional shape data of the wafer after processing in a case of inputting the cross-sectional shape data of the wafer before processing, to the learned model updated by the processing circuitry, and the cross-sectional shape data of the wafer before processing, approaches the effect associated with the specific group.

6. The etching processing apparatus according to claim 1, wherein the wafer has a same elemental composition, film density, and film structure of a target film to be etched as the processing wafer.

7. An etching processing method, comprising:

storing a learned model of each group generated by each learning processing in a case where each processing condition acquired during execution of a specific step of an etching processing, is classified into a plurality of groups according to a difference in effects when the specific step is executed, and the learning processing is performed for each group;

measuring, with a gauge, cross-sectional shape data of a wafer;

updating the learned model of a specific group when an effect calculated based on the cross-sectional shape data of the wafer measured by the gauge before and after executing the specific step using setting data included in a processing condition associated with the specific group is not equivalent to an effect associated with the specific group, wherein the effect associated with the specific group represents a change in cross-sectional shape data; and searching for, using the learned model updated in the updating, setting data which results in the effect associated with the specific group when the specific step is executed on the wafer.

8. The etching processing method according to claim 7, further comprising:

setting the setting data searched at the searching when the specific step is executed on the wafer.

9. The etching processing method according to claim 8, wherein the learned model is learned such that output data, when inputting cross-sectional shape data of the wafer before executing the specific step and the processing condition associated with the specific group, approaches cross-sectional shape data of the wafer after executing the specific step.

10. The etching processing method according to claim 9, wherein the updating updates a model parameter of the learned model of the specific group such that the effect calculated based on the cross-sectional shape data is equivalent to the effect associated with the specific group.

11. The etching processing method according to claim 7, wherein the searching searches for the setting data such that an effect calculated based on a predicted value of the cross-sectional shape data of the wafer after processing in a case of inputting the cross-sectional shape data of the wafer before processing, to the learned model updated at the updating, and the cross-sectional shape data of the wafer before processing, approaches the effect associated with the specific group.

12. A non-transitory computer-readable storage medium having stored therein an analysis program that causes a computer to execute a process comprising:

storing a learned model of each group generated by each learning processing in a case where each processing condition acquired during execution of a specific step of an etching processing, is classified into a plurality of groups according to a difference in effects when the specific step is executed, and the learning processing is performed for each group;

measuring, with a gauge, cross-sectional shape data of a wafer;

updating the learned model of a specific group when an effect calculated based on the cross-sectional shape data of the wafer measured by the gauge before and after executing the specific step using setting data included in a processing condition associated with the specific group is not equivalent to an effect associated with the specific group, wherein the effect associated with the specific group represents a change in cross-sectional shape data; and searching for, using the learned model updated in the updating, setting data which results in the effect associated with the specific group when the specific step is executed on the wafer.

13. The non-transitory computer-readable storage medium according to claim 12, wherein the process further comprises:

setting the setting data searched at the searching when the specific step is executed on the wafer.

14. The non-transitory computer-readable storage medium according to claim 13, wherein the learned model is learned such that output data, when inputting cross-sectional shape data of the wafer before executing the specific step and the processing condition associated with the specific group, approaches cross-sectional shape data of the wafer after executing the specific step.

15. The non-transitory computer-readable storage medium according to claim 14, wherein the updating updates a model parameter of the learned model of the specific group such that the effect calculated based on the cross-sectional shape data is equivalent to the effect associated with the specific group.

16. The non-transitory computer-readable storage medium according to claim 12, wherein the searching searches for the setting data such that an effect calculated based on a predicted value of the cross-sectional shape data of the wafer after processing in a case of inputting the cross-sectional shape data of the wafer before processing, to the learned model updated at the updating, and the cross-sectional shape data of the wafer before processing, approaches the effect associated with the specific group.

* * * * *